United States Patent
Choi et al.

(10) Patent No.: US 11,211,112 B2
(45) Date of Patent: Dec. 28, 2021

(54) SEMICONDUCTOR DEVICES CONTROLLING COLUMN OPERATION OF BANKS

(71) Applicant: SK hynix Inc., Icheon-si (KR)

(72) Inventors: Geun Ho Choi, Icheon-si (KR); Kyung Mook Kim, Icheon-si (KR); Woongrae Kim, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 16/920,224

(22) Filed: Jul. 2, 2020

(65) Prior Publication Data

US 2021/0249065 A1   Aug. 12, 2021

(30) Foreign Application Priority Data

Feb. 12, 2020  (KR) .......................... 10-2020-0016800

(51) Int. Cl.
  *G11C 11/4096*  (2006.01)
  *G11C 11/408*   (2006.01)
  *G11C 11/4094*  (2006.01)

(52) U.S. Cl.
  CPC ...... *G11C 11/4082* (2013.01); *G11C 11/4087* (2013.01); *G11C 11/4094* (2013.01); *G11C 11/4096* (2013.01)

(58) Field of Classification Search
  CPC ............ G11C 11/4082; G11C 11/4087; G11C 11/4096; G11C 11/4094
  See application file for complete search history.

(56) References Cited

U.S. PATENT DOCUMENTS

| 5,959,930 A * | 9/1999 | Sakurai ................ G11C 7/1072 365/230.03 |
| 2003/0142577 A1 * | 7/2003 | Kumazaki ............... G11C 8/12 365/230.06 |
| 2006/0120195 A1 * | 6/2006 | Kang ..................... G11C 5/147 365/226 |
| 2015/0098284 A1 * | 4/2015 | Lee ......................... G11C 8/18 365/193 |
| 2015/0310904 A1 | 10/2015 | Kim et al. |
| 2019/0325929 A1 * | 10/2019 | Kim ........................ G11C 7/12 |
| 2019/0333547 A1 * | 10/2019 | Ka .......................... G11C 11/40 |

FOREIGN PATENT DOCUMENTS

KR   1020100030510 A   3/2010

* cited by examiner

*Primary Examiner* — Mushfique Siddique (74) *Attorney, Agent, or Firm* — William Park & Associates Ltd.

(57) ABSTRACT

A semiconductor device includes an internal column control signal generation circuit, a bank address transfer circuit, and a first bank control circuit. The internal column control signal generation circuit generates a column control signal to output an internal column control signal. The bank address transfer circuit receives a bank address to generate an inverted bank address and outputs the bank address and the inverted bank address. The first bank control circuit generates a first bank active signal based on at least one of the bank address and the inverted bank address and latches the first bank active signal based on the internal column control signal to generate a first bank column control signal.

21 Claims, 12 Drawing Sheets

SEMICONDUCTOR DEVICES CONTROLLING COLUMN OPERATION OF BANKS

CROSS-REFERENCE TO RELATED APPLICATIONS

The present application claims priority under 35 U.S.C. 119(a) to Korean Application No. 10-2020-0016800, filed on Feb. 12, 2020, which is incorporated herein by reference in its entirety.

BACKGROUND

1. Technical Field

Embodiments of the present disclosure relate to semiconductor devices configured for controlling a column operation.

2. Related Art

In general, each of semiconductor devices such as dynamic random access memory (DRAM) devices may include a plurality of banks comprised of memory cells to which addresses are assigned. Each semiconductor device may simultaneously output data stored in memory cells having the same address among memory cells included in the plurality of banks. In order to simultaneously output the data stored in the memory cells having the same address, a column path circuit may perform a column operation decoding a column address to selectively enable one of a plurality of output enablement signals and simultaneously transmitting data loaded on bit lines in the banks, which are selected by the enabled output enablement signal, to input/output (I/O) lines.

SUMMARY

According to an embodiment, a semiconductor device may include an internal column control signal generation circuit, a bank address transfer circuit, and a first bank control circuit. The internal column control signal generation circuit may be configured to generate a column control signal to output an internal column control signal. The bank address transfer circuit may be configured to receive a bank address to generate an inverted bank address and may be configured to output the bank address and the inverted bank address. The first bank control circuit may be configured to generate a first bank active signal based on at least one of the bank address and the inverted bank address and may be configured to latch the first bank active signal based on the internal column control signal to generate a first bank column control signal.

According to another embodiment, a semiconductor device may include a pulse width adjustment circuit, a selection output circuit, and a first bank control circuit. The pulse width adjustment circuit may be configured to adjust a pulse width of pulses included in a column control signal to generate an adjusted pulse signal. The selection output circuit may be configured to generate a first internal column control signal and a second internal column control signal based on the adjusted pulse signal and a selection signal generated based on the adjusted pulse signal. The first bank control circuit may be configured to generate a first bank active signal based on at least one of a bank address and an inverted bank address and may be configured to latch the first bank active signal based on the first internal column control signal and the second internal column control signal to generate a first bank column control signal.

According to yet another embodiment, a semiconductor device may include an internal column control signal generation circuit, a first bank control circuit, and a second bank control circuit. The internal column control signal generation circuit may be configured to distribute a column control signal to generate a first internal column control signal and a second internal column control signal. The first bank control circuit may be configured to generate a first bank active signal based on at least one of a bank address and an inverted bank address and may be configured to latch the first bank active signal based on the first and second internal column control signals to generate a first bank column control signal for controlling a column operation for a first bank. The second bank control circuit may be configured to generate a second bank active signal based on at least one of the bank address and the inverted bank address and may be configured to latch the second bank active signal based on the first and second internal column control signals to generate a second bank column control signal for controlling the column operation for a second bank.

DETAILED DESCRIPTION

In the following description of the embodiments, when a parameter is referred to as being "predetermined", it may be intended to mean that a value of the parameter is determined in advance when the parameter is used in a process or an algorithm.

The value of the parameter may be set when the process or the algorithm starts or may be set during a period that the process or the algorithm is executed.

It will be understood that although the terms "first", "second", "third" etc. are used herein to describe various elements, these elements should not be limited by these terms. These terms are only used to distinguish one element from another element. Thus, a first element in some embodiments could be termed a second element in other embodiments without departing from the teachings of the present disclosure.

Further, it will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A logic "high" level and a logic "low" level may be used to describe logic levels of electric signals. A signal having a logic "high" level may be distinguished from a signal having a logic "low" level. For example, when a signal having a first voltage correspond to a signal having a logic "high" level, a signal having a second voltage correspond to a signal having a logic "low" level. In an embodiment, the logic "high" level may be set as a voltage level which is higher than a voltage level of the logic "low" level. Meanwhile, logic levels of signals may be set to be different or opposite according to the embodiments. For example, a certain signal having a logic "high" level in one embodiment may be set to have a logic "low" level in another embodiment.

Various embodiments of the present disclosure will be described hereinafter with reference to the accompanying drawings. However, the embodiments described herein are for illustrative purposes only and are not intended to limit the scope of the present disclosure.

Figure 1:
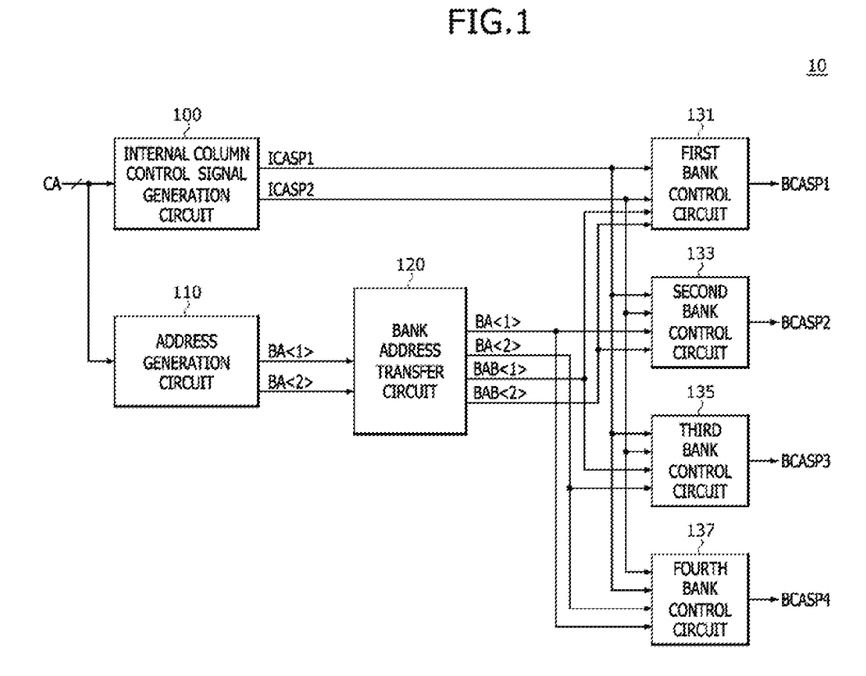
FIG. 1 is a block diagram illustrating a configuration of a semiconductor device according to an embodiment of the present disclosure.

FIG. 1 is a block diagram illustrating a configuration of a semiconductor device 10 according to an embodiment of the present disclosure. As illustrated in FIG. 1, the semiconductor device 10 may include an internal column control signal generation circuit 100, an address generation circuit 110, a bank address transfer circuit 120, a first bank control circuit 131, a second bank control circuit 133, a third bank control circuit 135, and a fourth bank control circuit 137.

The internal column control signal generation circuit 100 may generate a first internal column control signal ICASP1 and a second internal column control signal ICASP2 based on a control signal CA. The control signal CA may include a command and an address and may be provided by a controller (1300 of FIG. 12). The internal column control signal generation circuit 100 may decode a command included in the control signal CA to generate a column control signal (CASP of FIG. 2) for performing a column operation, may adjust a pulse width of pulses included in the column control signal CASP, and may distribute the adjusted pulses of the column control signal CASP to the first and second internal column control signals ICASP1 and ICASP2 to output the first and second internal column control signals ICASP1 and ICASP2 including the adjusted pulses. The pulses included in each of the first and second internal column control signals ICASP1 and ICASP2 may occur to have a cycle which is twice a cycle of the pulses included in the column control signal CASP. The column operation may include a write operation, a read operation, and a test operation.

The address generation circuit 110 may decode an address included in the control signal CA to generate a first bank address BA<1> and a second bank address BA<2>. A logic level combination of the first and second bank addresses BA<1:2> may be set to select one of first to fourth banks (not shown). For example, the first bank may be selected when both of the first and second bank addresses BA<1:2> have a logic "low" level, the second bank may be selected when the first bank address BA<1> has a logic "high" level and the second bank address BA<2> has a logic "low" level, the third bank may be selected when the first bank address BA<1> has a logic "low" level and the second bank address BA<2> has a logic "high" level, and the fourth bank may be selected when both of the first and second bank addresses BA<1:2> have a logic "high" level.

The bank address transfer circuit 120 may generate a first inverted bank address BAB<1> and a second inverted bank address BAB<2> from the first and second bank addresses BA<1:2>. The bank address transfer circuit 120 may output the first inverted bank address BAB<1> and the second inverted bank address BAB<2> to the first bank control circuit 131. The bank address transfer circuit 120 may output the first bank address BA<1> and the second inverted bank address BAB<2> to the second bank control circuit 133. The bank address transfer circuit 120 may output the first inverted bank address BAB<1> and the second bank address BA<2> to the third bank control circuit 135. The bank address transfer circuit 120 may output the first bank address BA<1> and the second bank address BA<2> to the fourth bank control circuit 137.

Figure 8:
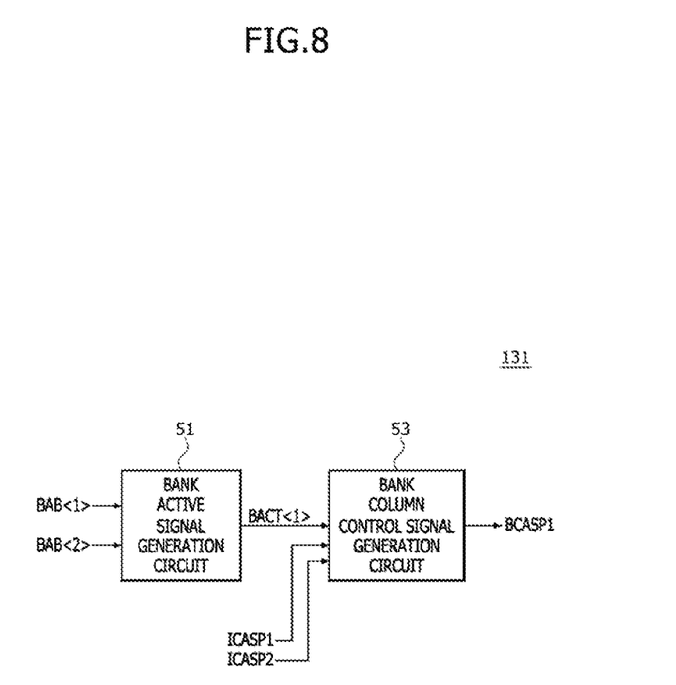
FIG. 8 is a block diagram illustrating a configuration of a first bank control circuit included in the semiconductor device illustrated in FIG. 1.

The first bank control circuit 131 may receive the first inverted bank address BAB<1> and the second inverted bank address BAB<2> to generate a first bank active signal (BACT<1> of FIG. 8). The first bank control circuit 131 may latch the first bank active signal BACT<1> based on the first and second internal column control signals ICASP1 and ICASP2 to generate a first bank column control signal BCASP1 for controlling the column operation for the first bank.

The second bank control circuit 133 may receive the first bank address BA<1> and the second inverted bank address BAB<2> to generate a second bank active signal (not shown). The second bank control circuit 133 may latch the second bank active signal based on the first and second internal column control signals ICASP1 and ICASP2 to generate a second bank column control signal BCASP2 for controlling the column operation for the second bank.

The third bank control circuit 135 may receive the first inverted bank address BAB<1> and the second bank address BA<2> to generate a third bank active signal (not shown). The third bank control circuit 135 may latch the third bank active signal based on the first and second internal column control signals ICASP1 and ICASP2 to generate a third bank column control signal BCASP3 for controlling the column operation for the third bank.

The fourth bank control circuit 137 may receive the first bank address BA<1> and the second bank address BA<2> to generate a fourth bank active signal (not shown). The fourth bank control circuit 137 may latch the fourth bank active signal based on the first and second internal column control signals ICASP1 and ICASP2 to generate a fourth bank column control signal BCASP4 for controlling the column operation for the fourth bank.

According to the semiconductor device 10 described above, an occurrence cycle of the pulses included in each of the first and second internal column control signals ICASP1 and ICASP2 may be set to be greater than an occurrence cycle of the pulses included in the column control signal CASP. Thus, the semiconductor device 10 may stably latch the first to fourth bank active signals (including the first bank active signal BACT<1> of FIG. 8) even at a high operation speed to generate the first bank column control signal BCASP1, the second bank column control signal BCASP2, the third bank column control signal BCASP3, and the fourth bank column control signal BCASP4 for performing the column operations for the first to fourth banks.

According to the semiconductor device 10 described above, a pulse width of the pulses included in each of the first and second internal column control signals ICASP1 and ICASP2 may be set to be greater than a pulse width of the pulses included in the column control signal CASP. Accordingly, the semiconductor device 10 may stably latch the first to fourth bank active signals (including the first bank active signal BACT<1> of FIG. 8) even at a high operation speed to generate the first bank column control signal BCASP1, the second bank column control signal BCASP2, the third bank column control signal BCASP3, and the fourth bank column control signal BCASP4 for performing the column operations for the first to fourth banks.

Figure 2:
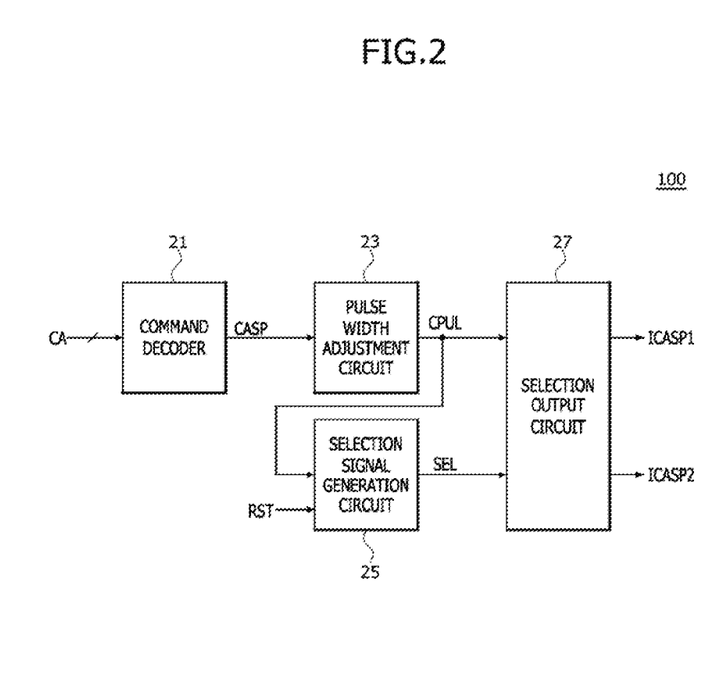
FIG. 2 is a block diagram illustrating a configuration of an internal column control signal generation circuit included in the semiconductor device illustrated in FIG. 1.

FIG. 2 is a block diagram illustrating a configuration of the internal column control signal generation circuit 100. As illustrated in FIG. 2, the internal column control signal generation circuit 100 may include a command decoder 21, a pulse width adjustment circuit 23, a selection signal generation circuit 25, and a selection output circuit 27.

The command decoder 21 may decode a command included in the control signal CA to generate the column control signal CASP for the column operation. The control signal CA may include a plurality of bits to perform various operations included in the column operation.

The pulse width adjustment circuit 23 may adjust a pulse width of pulses included in the column control signal CASP to generate an adjusted pulse signal CPUL. Although the present embodiment describes an example that increases a pulse width of the pulses included in the column control signal CASP to generate the adjusted pulse signal CPUL, the present disclosure is not limited thereto.

The selection signal generation circuit 25 may generate a selection signal SEL based on a reset signal RST and the adjusted pulse signal CPUL. The selection signal generation circuit 25 may initialize the selection signal SEL to a predetermined logic level based on the reset signal RST. In the present embodiment, the predetermined logic level may be set as a first logic level. The selection signal generation circuit 25 may generate the selection signal SEL having a logic level transition that occurs at a point in time (hereinafter, referred to as a 'falling edge') when a logic level of the adjusted pulse signal CPUL changes from a logic "high" level into a logic "low" level. The selection signal generation circuit 25 may be synchronized with a falling edge of the adjusted pulse signal CPUL to generate the selection signal SEL having a logic level that changes from the first logic level into a second logic level or from the second logic level into the first logic level. In the present embodiment, the first logic level may be set as a logic "low" level, and the second logic level may be set as a logic "high" level. However, in some other embodiments, the first and second logic levels may be set to be different from the present embodiment.

The selection output circuit 27 may output the adjusted pulse signal CPUL as the first or second internal column control signal ICASP1 or ICASP2 based on the selection signal SEL. The selection output circuit 27 may output the adjusted pulse signal CPUL as the first internal column control signal ICASP1 when the selection signal SEL has the first logic level and may output the adjusted pulse signal CPUL as the second internal column control signal ICASP2 when the selection signal SEL has the second logic level.

Figure 3:
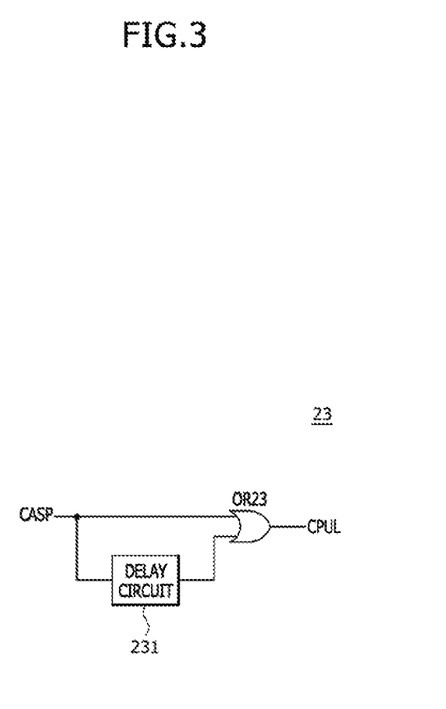
FIG. 3 is a circuit diagram illustrating an example of a pulse width adjustment circuit included in the internal column control signal generation circuit illustrated in FIG. 2.

FIG. 3 is a circuit diagram illustrating an example of the pulse width adjustment circuit 23. As illustrated in FIG. 3, the pulse width adjustment circuit 23 may include a delay circuit 231 and an OR gate OR23 which are electrically connected to each other. The delay circuit 231 may delay the column control signal CASP by a predetermined period to output the delayed signal of the column control signal CASP. The OR gate OR23 may receive the column control signal CASP and an output signal of the delay circuit 231 and may perform a logical OR operation of the column control signal CASP and an output signal of the delay circuit 231 to generate the adjusted pulse signal CPUL. The pulse width adjustment circuit 23 may increase a pulse width of the pulses included in the column control signal CASP by a delay period of the delay circuit 231 to output pulses having the increased pulse width as the adjusted pulse signal CPUL.

Figure 4:
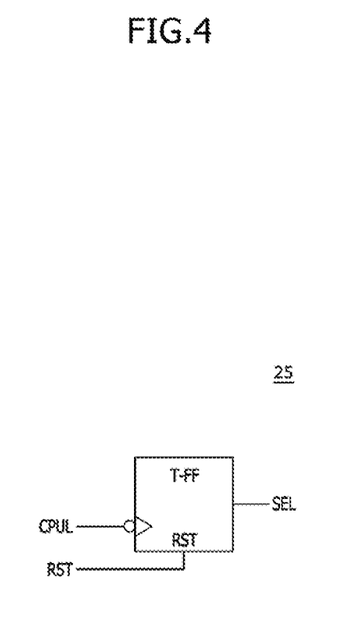
FIG. 4 is a circuit diagram illustrating an example of a selection signal generation circuit included in the internal column control signal generation circuit illustrated in FIG. 2.

FIG. 4 is a circuit diagram illustrating an example of the selection signal generation circuit 25. As illustrated in FIG. 4, the selection signal generation circuit 25 may include a T-flipflop. The T-flipflop may initialize the selection signal SEL to a logic "low" level when the reset signal RST is generated to an initialization operation. The T-flipflop may change a logic level of the selection signal SEL from a logic "low" level into a logic "high" level when a first falling edge of the adjusted pulse signal CPUL occurs. The T-flipflop may change a logic level of the selection signal SEL from a logic "high" level into a logic "low" level when a second falling edge of the adjusted pulse signal CPUL occurs. The T-flipflop may change a logic level of the selection signal SEL from a logic "low" level into a logic "high" level when a third falling edge of the adjusted pulse signal CPUL occurs.

Figure 5:
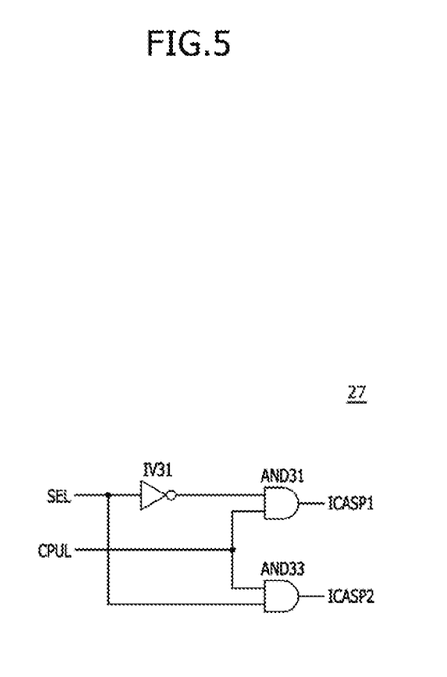
FIG. 5 is a circuit diagram illustrating an example of a selection output circuit included in the internal column control signal generation circuit illustrated in FIG. 2.

FIG. 5 is a circuit diagram illustrating an example of the selection output circuit 27. As illustrated in FIG. 5, the selection output circuit 27 may include an inverter IV31 and AND gates AND31 and AND33 which are electrically coupled to each other. The inverter IV31 may inversely buffer the selection signal SEL to output the inversely buffered signal of the selection signal SEL. The AND gate AND31 may receive an output signal of the inverter IV31 and the adjusted pulse signal CPUL and may perform a logical AND operation of an output signal of the inverter IV31 and the adjusted pulse signal CPUL to generate the first internal column control signal ICASP1. The AND gate AND33 may receive the selection signal SEL and the adjusted pulse signal CPUL and may perform a logical AND operation of the selection signal SEL and the adjusted pulse signal CPUL to generate the second internal column control signal ICASP2. The selection output circuit 27 may output the adjusted pulse signal CPUL as the first internal column control signal ICASP1 when the selection signal SEL has a logic "low" level and may output the adjusted pulse signal CPUL as the second internal column control signal ICASP2 when the selection signal SEL has a logic "high" level.

Figure 6:
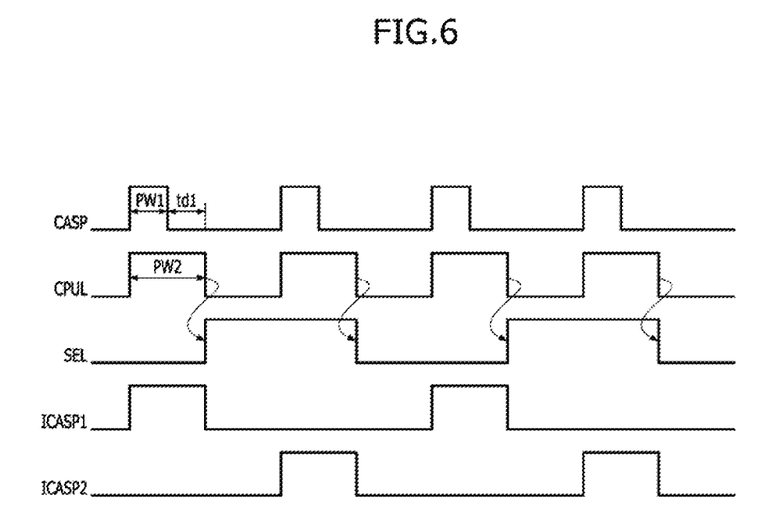
FIG. 6 is a timing diagram illustrating an operation of the internal column control signal generation circuit illustrated in FIGS. 2 to 5.

FIG. 6 is a timing diagram illustrating an operation of the internal column control signal generation circuit 100. As illustrated in FIG. 6, the column control signal CASP may be generated by decoding a command included in the control signal CA for the column operation. A first pulse width PW1 of the pulses included in the column control signal CASP may be adjusted to provide the adjusted pulse signal CPUL. A second pulse width PW2 of the pulses included in the adjusted pulse signal CPUL may be set to be greater than the first pulse width PW1 by a period of 'td1'. A logic level of the selection signal SEL may change from a logic "low" level into a logic "high" level when a first falling edge of the adjusted pulse signal CPUL occurs, may change from a logic "high" level into a logic "low" level when a second falling edge of the adjusted pulse signal CPUL occurs, may change from a logic "low" level into a logic "high" level when a third falling edge of the adjusted pulse signal CPUL occurs, and may change from a logic "high" level into a logic "low" level when a fourth falling edge of the adjusted pulse signal CPUL occurs. The adjusted pulse signal CPUL may be outputted as the first internal column control signal ICASP1 when the selection signal SEL has a logic "low" level and may be outputted as the second internal column control signal ICASP2 when the selection signal SEL has a logic "high" level.

Figure 7:
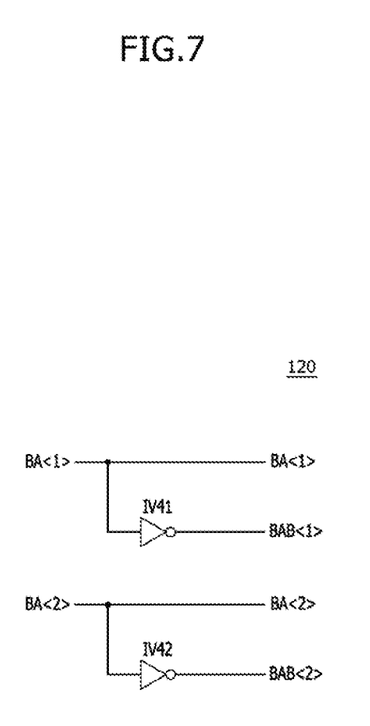
FIG. 7 is a circuit diagram illustrating an example of a bank address transfer circuit included in the semiconductor device illustrated in FIG. 1.

FIG. 7 is a circuit diagram illustrating an example of the bank address transfer circuit 120. As illustrated in FIG. 7, the bank address transfer circuit 120 may include inverters IV41 and IV42. The inverter IV41 may inversely buffer the first bank address BA<1> to generate the first inverted bank address BAB<1>. The inverter IV42 may inversely buffer the second bank address BA<2> to generate the second inverted bank address BAB<2>. The bank address transfer circuit 120 may output the first bank address BA<1>, second bank address BA<2>, the first inverted bank address BAB<1>, and the second inverted bank address BAB<2>.

FIG. 8 is a block diagram illustrating a configuration of the first bank control circuit 131. As illustrated in FIG. 8, the first bank control circuit 131 may include a bank active signal generation circuit 51 and a bank column control signal generation circuit 53.

The bank active signal generation circuit 51 may generate the first bank active signal BACT<1> based on the first inverted bank address BAB<1> and the second inverted bank address BAB<2>. The bank active signal generation circuit 51 may generate the first bank active signal BACT<1> when the first inverted bank address BAB<1> and the second inverted bank address BAB<2> are generated to have a predetermined logic level. The predetermined logic level of the first inverted bank address BAB<1> and the second inverted bank address BAB<2> may be set to be different according to the embodiments.

The bank column control signal generation circuit 53 may latch the first bank active signal BACT<1> based on the first internal column control signal ICASP1 and the second internal column control signal ICASP2 to generate the first bank column control signal BCASP1 for controlling the column operation for the first bank. The bank column control signal generation circuit 53 may latch the first bank active signal BACT<1> generated by the first and second inverted bank addresses BAB<1> and BAB<2> to generate the first bank column control signal BCASP1 when a pulse of the first internal column control signal ICASP1 or the second internal column control signal ICASP2 occurs. Because an occurrence cycle of the pulses included in each of the first and second internal column control signals ICASP1 and ICASP2 is set to be greater than an occurrence cycle of the pulses included in the column control signal CASP, the first bank active signal BACT<1> may be stably latched even at a high operation speed to generate the first bank column control signal BCASP1 for performing the column operations for the first bank.

Figure 9:
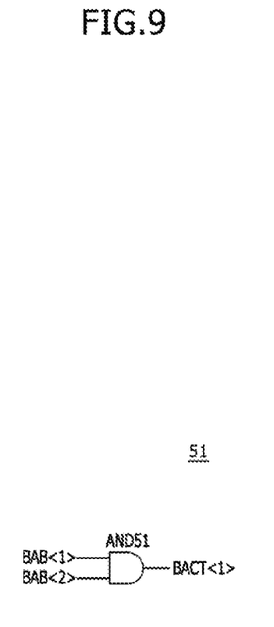
FIG. 9 is a circuit diagram illustrating an example of a bank active signal generation circuit included in the first bank control circuit illustrated in FIG. 8.

FIG. 9 is a circuit diagram illustrating an example of the bank active signal generation circuit 51. As illustrated in FIG. 9, the bank active signal generation circuit 51 may include an AND gate AND51. The AND gate AND51 may receive the first inverted bank address BAB<1> and the second inverted bank address BAB<2> and may perform a logical AND operation of the first inverted bank address BAB<1> and the second inverted bank address BAB<2> to generate the first bank active signal BACT<1>. The AND gate AND51 may generate the first bank active signal BACT<1> having a logic "high" level when both of the first inverted bank address BAB<1> and the second inverted bank address BAB<2> have a logic "high" level.

Figure 10:
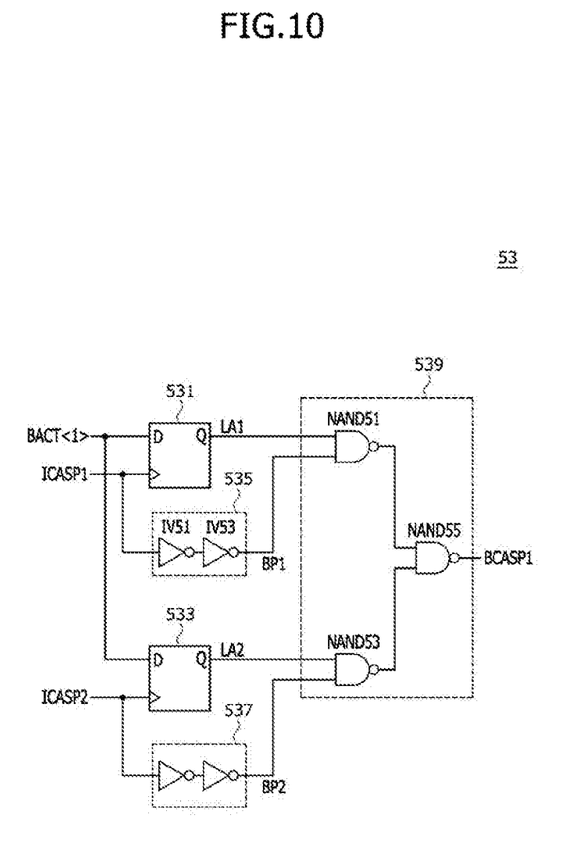
FIG. 10 is a circuit diagram illustrating an example of a bank column control signal generation circuit included in the first bank control circuit illustrated in FIG. 8.

FIG. 10 is a circuit diagram illustrating an example of the bank column control signal generation circuit 53. As illustrated in FIG. 10, the bank column control signal generation circuit 53 may include a first latched active signal generation circuit 531, a second latched active signal generation circuit 533, a first bank pulse generation circuit 535, a second bank pulse generation circuit 537, and a bank synthesis circuit 539.

The first latched active signal generation circuit 531 may generate a first latched active signal LA1 based on the first internal column control signal ICASP1 and the first bank active signal BACT<1>. The first latched active signal generation circuit 531 may latch the first bank active signal BACT<1> to generate the first latched active signal LA1 when a pulse of the first internal column control signal ICASP1 occurs.

The second latched active signal generation circuit 533 may generate a second latched active signal LA2 based on the second internal column control signal ICASP2 and the first bank active signal BACT<1>. The second latched active signal generation circuit 533 may latch the first bank active signal BACT<1> to generate the second latched active signal LA2 when a pulse of the second internal column control signal ICASP2 occurs.

The first bank pulse generation circuit 535 may include inverters IN51 and IV53 coupled in series and may buffer the first internal column control signal ICASP1 to generate a first bank pulse BP1. The second bank pulse generation circuit 537 may include a couple of inverters coupled in series and may buffer the second internal column control signal ICASP2 to generate a second bank pulse BP2.

The bank synthesis circuit 539 may include NAND gates NAND51, NAND53, and NAND55. The NAND gate NAND51 may receive the first latched active signal LA1 and the first bank pulse BP1 to perform a logical NAND operation of the first latched active signal LA1 and the first bank pulse BP1. The NAND gate NAND53 may receive the second latched active signal LA2 and the second bank pulse BP2 to perform a logical NAND operation of the second latched active signal LA2 and the second bank pulse BP2. The NAND gate NAND55 may receive an output signal of the NAND gate NAND51 and an output signal of the NAND gate NAND53 and may perform a logical NAND operation of the output signals of the NAND gates NAND51 and NAND53 to generate the first bank column control signal BCASP1.

Figure 11:
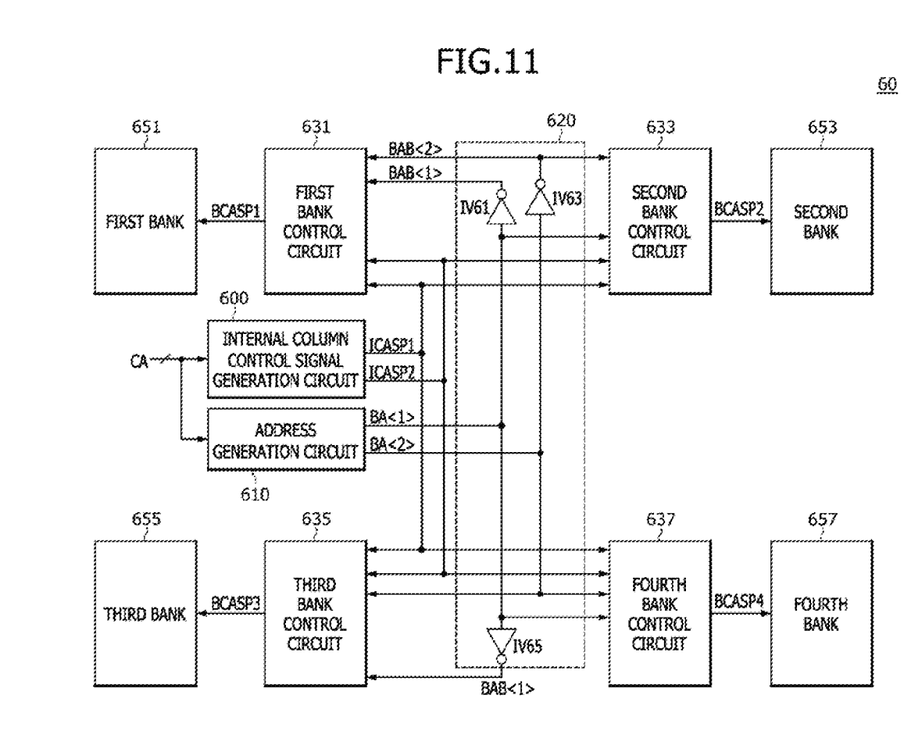
FIG. 11 is a block diagram illustrating a configuration of a semiconductor device according to another embodiment of the present disclosure.

FIG. 11 is a block diagram illustrating a configuration of a semiconductor device 60 according to another embodiment of the present disclosure. As illustrated in FIG. 11, the semiconductor device 60 may include an internal column control signal generation circuit 600, an address generation circuit 610, a bank address transfer circuit 620, a first bank control circuit 631, a second bank control circuit 633, a third bank control circuit 635, a fourth bank control circuit 637, a first bank 651, a second bank 653, a third bank 655, and a fourth bank 657.

The internal column control signal generation circuit 600 may generate a first internal column control signal ICASP1 and a second internal column control signal ICASP2 based on a control signal CA. The control signal CA may include a command and an address. The internal column control signal generation circuit 600 may decode a command included in the control signal CA to generate a column control signal (CASP of FIG. 2) for performing a column operation, may adjust a pulse width of pulses included in the column control signal CASP, and may distribute the adjusted pulses of the column control signal CASP to the first and second internal column control signals ICASP1 and ICASP2 to output the first and second internal column control signals ICASP1 and ICASP2 including the adjusted pulses. The pulses included in each of the first and second internal column control signals ICASP1 and ICASP2 may occur to have a cycle which is twice a cycle of the pulses included in the column control signal CASP. The column operation may include a write operation, a read operation, and a test operation. Although the present embodiment describes an example in which the internal column control signal generation circuit 600 is disposed to be surrounded by the first bank 651, the second bank 653, the third bank 655, and the fourth bank 657, the present disclosure is not limited thereto.

The address generation circuit 610 may decode an address included in the control signal CA to generate a first bank address BA<1> and a second bank address BA<2>. A logic level combination of the first and second bank addresses BA<1:2> may be set to select one of first to fourth banks 651, 653, 655, and 657. Although the present embodiment describes an example in which the address generation circuit 610 is disposed to be surrounded by the first bank 651, the second bank 653, the third bank 655, and the fourth bank 657, the present disclosure is not limited thereto.

The bank address transfer circuit 620 may include inverters IV61, IV63, and IV65 which are electrically coupled to each other. The inverter IV61 may inversely buffer the first bank address BA<1> to generate a first inverted bank address BAB<1> and may output the first inverted bank address BAB<1> to the first bank control circuit 631. The inverter IV63 may inversely buffer the second bank address BA<2> to generate a second inverted bank address BAB<2> and may output the second inverted bank address BAB<2> to the first bank control circuit 631 and the second bank control circuit 633. The inverter IV65 may inversely buffer the first bank address BA<1> to generate the first inverted bank address BAB<1> and may output the first inverted bank address BAB<1> to the third bank control circuit 635. The inverters IV61, IV63, and IV65 may act as a repeater. The bank address transfer circuit 620 may output the first inverted bank address BAB<1> to the first bank control circuit 631 through the inverter IV61 and may output the second inverted bank address BAB<2> to the first bank control circuit 631 through the inverter IV63. The bank address transfer circuit 620 may transfer the first bank address BA<1> to the second bank control circuit 633 and may output the second inverted bank address BAB<2> to the second bank control circuit 633 through the inverter IV63. The bank address transfer circuit 620 may output the first inverted bank address BAB<1> to the third bank control circuit 635 through the inverter IV65 and may transfer the second bank address BA<2> to the third bank control circuit 635. The bank address transfer circuit 620 may transfer the first bank address BA<1> to the fourth bank control circuit 637 and may transfer the second bank address BA<2> to the fourth bank control circuit 637.

The first bank control circuit 631 may receive the first inverted bank address BAB<1> and the second inverted bank address BAB<2> to generate a first bank active signal (not shown). The first bank control circuit 631 may latch the first bank active signal based on the first and second internal column control signals ICASP1 and ICASP2 to generate a first bank column control signal BCASP1 for controlling the column operation for the first bank 651.

The second bank control circuit 633 may receive the first bank address BA<1> and the second inverted bank address BAB<2> to generate a second bank active signal (not shown). The second bank control circuit 633 may latch the second bank active signal based on the first and second internal column control signals ICASP1 and ICASP2 to generate a second bank column control signal BCASP2 for controlling the column operation for the second bank 653.

The third bank control circuit 635 may receive the first inverted bank address BAB<1> and the second bank address BA<2> to generate a third bank active signal (not shown). The third bank control circuit 635 may latch the third bank active signal based on the first and second internal column control signals ICASP1 and ICASP2 to generate a third bank column control signal BCASP3 for controlling the column operation for the third bank 655.

The fourth bank control circuit 637 may receive the first bank address BA<1> and the second bank address BA<2> to generate a fourth bank active signal (not shown). The fourth bank control circuit 637 may latch the fourth bank active signal based on the first and second internal column control signals ICASP1 and ICASP2 to generate a fourth bank column control signal BCASP4 for controlling the column operation for the fourth bank 657.

In the present embodiment, the first bank control circuit 631 and the first bank 651 may be located at a first edge of the semiconductor device 60, the second bank control circuit 633 and the second bank 653 may be located at a second edge of the semiconductor device 60, the third bank control circuit 635 and the third bank 655 may be located at a third edge of the semiconductor device 60, and the fourth bank control circuit 637 and the fourth bank 657 may be located at a fourth edge of the semiconductor device 60. Although the present embodiment describes an example in which the first edge corresponds to an upper-left corner of the semiconductor device 60, the second edge corresponds to an upper-right corner of the semiconductor device 60, the third edge corresponds to a lower-left corner of the semiconductor device 60, and the fourth edge corresponds to a lower-right corner of the semiconductor device 60, the present disclosure is not limited thereto. In an embodiment, the internal column control signal generation circuit may be located between the first bank 651 and the second bank 653.

According to the semiconductor device 60 described above, an occurrence cycle of the pulses included in each of the first and second internal column control signals ICASP1 and ICASP2 may be set to be greater than an occurrence cycle of the pulses included in the column control signal generated in the internal column control signal generation circuit 600. Thus, the semiconductor device 60 may stably latch the first to fourth bank active signals generated in the first to fourth bank control circuits 631, 633, 635, and 637 even at a high operation speed to generate the first bank column control signal BCASP1, the second bank column control signal BCASP2, the third bank column control signal BCASP3, and the fourth bank column control signal BCASP4 for performing the column operations for the first to fourth banks 651, 653, 655, and 657.

According to the semiconductor device 60 described above, a pulse width of the pulses included in each of the first and second internal column control signals ICASP1 and ICASP2 may be set to be greater than a pulse width of the pulses included in the column control signal. Accordingly, the semiconductor device 60 may stably latch the first to fourth bank active signals generated in the first to fourth bank control circuits 631, 633, 635, and 637 even at a high operation speed to generate the first bank column control signal BCASP1, the second bank column control signal BCASP2, the third bank column control signal BCASP3, and the fourth bank column control signal BCASP4 for performing the column operations for the first to fourth banks 651, 653, 655, and 657.

According to the semiconductor device 60 described above, the first bank address BA<1>, the second bank address BA<2>, the first inverted bank address BAB<1>, and the second inverted bank address BAB<2> may be transmitted to the first to fourth bank control circuits 631, 633, 635, and 637 and may be decoded by the first to fourth bank control circuits 631, 633, 635, and 637. Thus, the number of transmission lines through which the bank addresses are transmitted may be minimized to reduce a layout area and power consumption of the semiconductor device 60.

Figure 12:
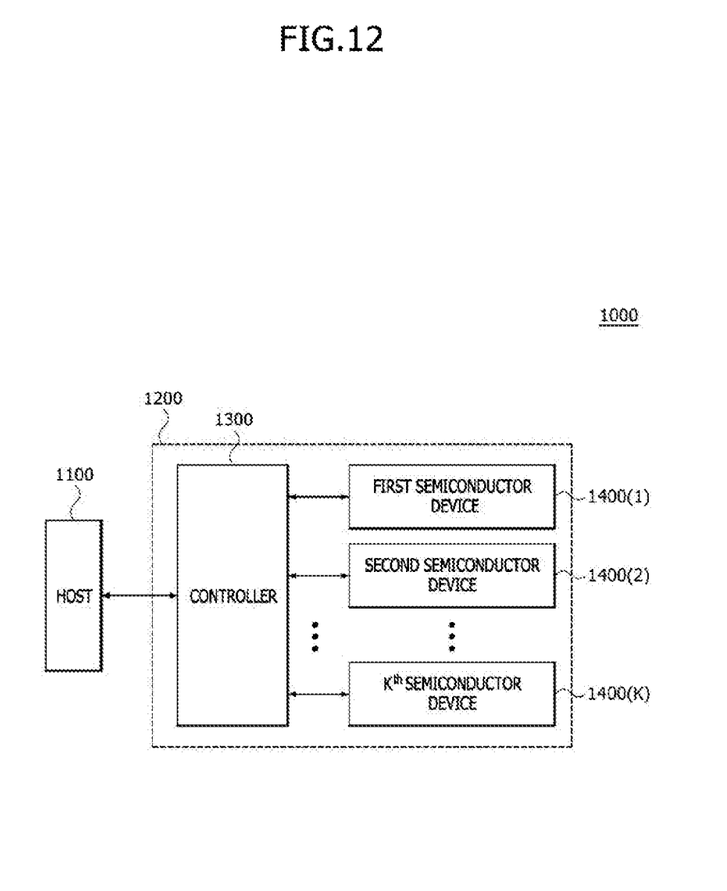
FIG. 12 is a block diagram illustrating a configuration of an electronic system employing at least one of the semiconductor devices illustrated in FIGS. 1 and 11.

FIG. 12 is a block diagram illustrating a configuration of an electronic system 1000 employing at least one of the semiconductor devices 10 and 60 illustrated in FIGS. 1 and 11. As illustrated in FIG. 12, the electronic system 1000 may include a host 1100 and a semiconductor system 1200.

The host 1100 and the semiconductor system 1200 may transmit signals to each other using an interface protocol. The interface protocol used for communication between the host 1100 and the semiconductor system 1200 may include any one of various interface protocols such as a multi-media card (MMC), an enhanced small device interface (ESDI), an integrated drive electronics (IDE), a peripheral component interconnect-express (PCI-E), an advanced technology attachment (ATA), a serial ATA (SATA), a parallel ATA (PATA), a serial attached SCSI (SAS), and a universal serial bus (USB).

The semiconductor system 1200 may include a controller 1300 and semiconductor devices 1400(K:1). The controller 1300 may control the semiconductor devices 1400(K:1) to generate bank column control signals for controlling the column operation for each bank using the first and second internal column control signals ICASP1 and ICASP2 generated by distributing the pulses included in the column control signal CASP. Each of the semiconductor devices 1400(K:1) may stably perform the column operation even though a cycle and a pulse width of pulses of the column control signal CASP are reduced at a high operation speed.

Each of the semiconductor devices 1400(K:1) may be realized using the semiconductor device 10 illustrated in FIG. 1 or the semiconductor device 60 illustrated in FIG. 11. In some embodiments, each of the semiconductor devices 1400(K:1) may be realized using any one of a dynamic random access memory (DRAM), a phase change random access memory (PRAM), a resistive random access memory (RRAM), a magnetic random access memory (MRAM), and a ferroelectric random access memory (FRAM).

The concepts have been disclosed in conjunction with some embodiments as described above. Those skilled in the art will appreciate that various modifications, additions and substitutions are possible, without departing from the scope and spirit of the present disclosure. Accordingly, the embodiments disclosed in the present specification should be considered from not a restrictive standpoint but an illustrative standpoint. The scope of the concepts are not limited to the above descriptions but defined by the accompanying claims, and all of distinctive features in the equivalent scope should be construed as being included in the concepts.

What is claimed is:

1. A semiconductor device comprising:
   an internal column control signal generation circuit configured to generate a column control signal, and generate a selection signal based on an adjusted pulse signal to output the adjusted pulse signal as one of a first internal column control signal and a second internal column control signal based on the selection signal;
   a bank address transfer circuit configured to receive a bank address to generate an inverted bank address and configured to output the bank address and the inverted bank address; and
   a first bank control circuit configured to generate a first bank active signal based on at least one of the bank address and the inverted bank address and configured to latch the first bank active signal based on the first internal column control signal and the second internal column control signal to generate a first bank column control signal.

2. The semiconductor device of claim 1, wherein the column control signal is generated by decoding a command included in a control signal, in order to perform a column operation.

3. The semiconductor device of claim 2, wherein the column operation includes at least one of a write operation, a read operation, and a test operation.

4. The semiconductor device of claim 1, wherein the internal column control signal generation circuit is configured to adjust a pulse width of pulses included in the column control signal to generate the adjusted pulse signal and is configured to generate the first internal column control signal and the second internal column control signal from pulses included in the adjusted pulse signal.

5. The semiconductor device of claim 4,
   wherein the internal column control signal generation circuit distributes the pulses included in the adjusted pulse signal to the first internal column control signal and the second internal column control signal to output the first internal column control signal and the second internal column control signal.

6. The semiconductor device of claim 1,
   wherein the internal column control signal generation circuit includes:
   a pulse width adjustment circuit configured to adjust a pulse width of pulses included in the column control signal to generate an adjusted pulse signal; and
   a selection output circuit configured to generate the first internal column control signal and the second internal column control signal based on the adjusted pulse signal and a selection signal generated based on the adjusted pulse signal.

7. The semiconductor device of claim 6, wherein a pulse width of pulses included in the adjusted pulse signal is set to be greater than a pulse width of the pulses included in the column control signal.

8. The semiconductor device of claim 6,
   wherein a logic level transition of the selection signal occurs based on the adjusted pulse signal; and wherein the adjusted pulse signal is outputted as one of the first internal column control signal and the second internal column control signal according to a logic level of the selection signal.

9. The semiconductor device of claim 8,
wherein the adjusted pulse signal is outputted as the first internal column control signal when the selection signal has a first logic level, and
Wherein the adjusted pulse signal is outputted as the second internal column control signal when the selection signal has a second logic level, the second logic level different from the first logic level.

10. The semiconductor device of claim 1,
wherein the bank address includes a first bank address and a second bank address;
wherein the inverted bank address includes a first inverted bank address and a second inverted bank address; and
wherein the bank address transfer circuit transfers the first inverted bank address and the second inverted bank address to the first bank control circuit.

11. The semiconductor device of claim 10,
wherein the first bank control circuit is configured to generate the first bank active signal based on the first inverted bank address and the second inverted bank address and is configured to latch the first bank active signal based on the first internal column control signal and the second internal column control signal to generate the first bank column control signal.

12. The semiconductor device of claim 10, further comprising a second bank control circuit configured to generate a second bank active signal based on the first bank address and the second inverted bank address and is configured to latch the second bank active signal based on the first internal column control signal and the second internal column control signal to generate a second bank column control signal.

13. The semiconductor device of claim 12, wherein the bank address transfer circuit transfers the first bank address and the second inverted bank address to the second bank control circuit.

14. A semiconductor device comprising:
a pulse width adjustment circuit configured to adjust a pulse width of pulses included in a column control signal to generate an adjusted pulse signal;
a selection output circuit configured to output the adjusted pulse signal as one of a first internal column control signal and a second internal column control signal based on a selection signal generated based on the adjusted pulse signal; and
a first bank control circuit configured to generate a first bank active signal based on at least one of a bank address and an inverted bank address and configured to latch the first bank active signal based on the first internal column control signal and the second internal column control signal to generate a first bank column control signal.

15. The semiconductor device of claim 14, wherein the column control signal is generated by decoding a command included in a control signal, in order to perform a column operation including at least one of a write operation, a read operation, and a test operation.

16. The semiconductor device of claim 14, wherein a pulse width of pulses included in the adjusted pulse signal is set to be greater than a pulse width of the pulses included in the column control signal.

17. The semiconductor device of claim 14,
wherein a logic level transition of the selection signal occurs based on the adjusted pulse signal; and
wherein the adjusted pulse signal is outputted as one of the first internal column control signal and the second internal column control signal according to a logic level of the selection signal.

18. The semiconductor device of claim 14,
wherein the bank address includes a first bank address and a second bank address;
wherein the inverted bank address includes a first inverted bank address and a second inverted bank address; and
wherein the semiconductor device further includes a bank address transfer circuit configured to output the first inverted bank address and the second inverted bank address to the first bank control circuit.

19. The semiconductor device of claim 14,
wherein the bank address includes a first bank address and a second bank address;
wherein the inverted bank address includes a first inverted bank address and a second inverted bank address; and
wherein the semiconductor device further includes a second bank control circuit configured to generate a second bank active signal based on the first bank address and the second inverted bank address and configured to latch the second bank active signal based on the first and second internal column control signals to generate a second bank column control signal.

20. A semiconductor device comprising:
an internal column control signal generation circuit configured to generate a column control signal, and generate a selection signal based on an adjusted pulse signal to output the adjusted pulse signal as one of a first internal column control signal and a second internal column control signal based on the selection signal;
a first bank control circuit configured to generate a first bank active signal based on a first logic level combination of first bank address and second bank address and configured to latch the first bank active signal based on the first and second internal column control signals to generate a first bank column control signal for controlling a column operation for a first bank; and
a second bank control circuit configured to generate a second bank active signal based on a second logic level combination of the first bank address and the second bank address and configured to latch the second bank active signal based on the first and second internal column control signals to generate a second bank column control signal for controlling the column operation for a second bank.

21. The semiconductor device of claim 20,
wherein the first bank and the first bank control circuit are located at a first edge of the semiconductor device;
wherein the second bank and the second bank control circuit are located at a second edge of the semiconductor device; and
wherein the internal column control signal generation circuit is located between the first bank and the second bank.

* * * * *